United States Patent [19]

Donaldson et al.

[11] Patent Number: 5,229,926
[45] Date of Patent: Jul. 20, 1993

US005229926A

[54] POWER SUPPLY INTERLOCK FOR A DISTRIBUTED POWER SYSTEM

[75] Inventors: Darrel D. Donaldson, Lancaster; Daniel Wissell, Acton, both of Mass.

[73] Assignee: Digital Equipment Corporation, Maynard, Mass.

[21] Appl. No.: 862,004

[22] Filed: Apr. 1, 1992

[51] Int. Cl.⁵ .......................................... H03K 19/003
[52] U.S. Cl. ..................................... 363/50; 363/147; 361/101; 364/240; 364/273
[58] Field of Search .......................... 363/49, 50, 147; 361/65, 95, 101; 364/240, 240.2, 240.5, 242.92, 273, 273.1, 273.2, 273.3, 273.4, 273.5

[56] References Cited

U.S. PATENT DOCUMENTS

| | | |
|---|---|---|
| 4,279,020 | 7/1981 | Christian et al. .................. 364/900 |
| 4,794,525 | 12/1988 | Pickert et al. ..................... 364/200 |
| 4,900,951 | 2/1990 | Saito et al. ........................ 364/200 |
| 5,008,846 | 4/1991 | Inoue ................................. 364/707 |
| 5,014,236 | 5/1991 | Pogorzelski et al. ............... 364/900 |

*Primary Examiner*—Emanuel T. Voeltz
*Attorney, Agent, or Firm*—Cesari and McKenna

[57] ABSTRACT

A power supply interlock technique for an electronic system which uses metal oxide semiconductor (MOS) logic circuits require two or more different supply voltages, and where each circuit board module contains its own power supplies. An open-collector enable signal is both controlled and sensed by each of the modules. The enable signal is set true when all of the supplies in the system are operating properly. However, the enable signal is set false by any one of the modules if one of the higher voltage supplies on that module is malfunctioning. The enable line also controls the lower voltage power supplies in each module. None of the lower voltage power supplies is thus permitted to operate until the enable line is set true, which occurs only when all of the modules indicate they have an operating high voltage supply available. As a result, latch-up of parasitic transistors in the circuits which drive logic signals on a system bus is avoided.

14 Claims, 4 Drawing Sheets

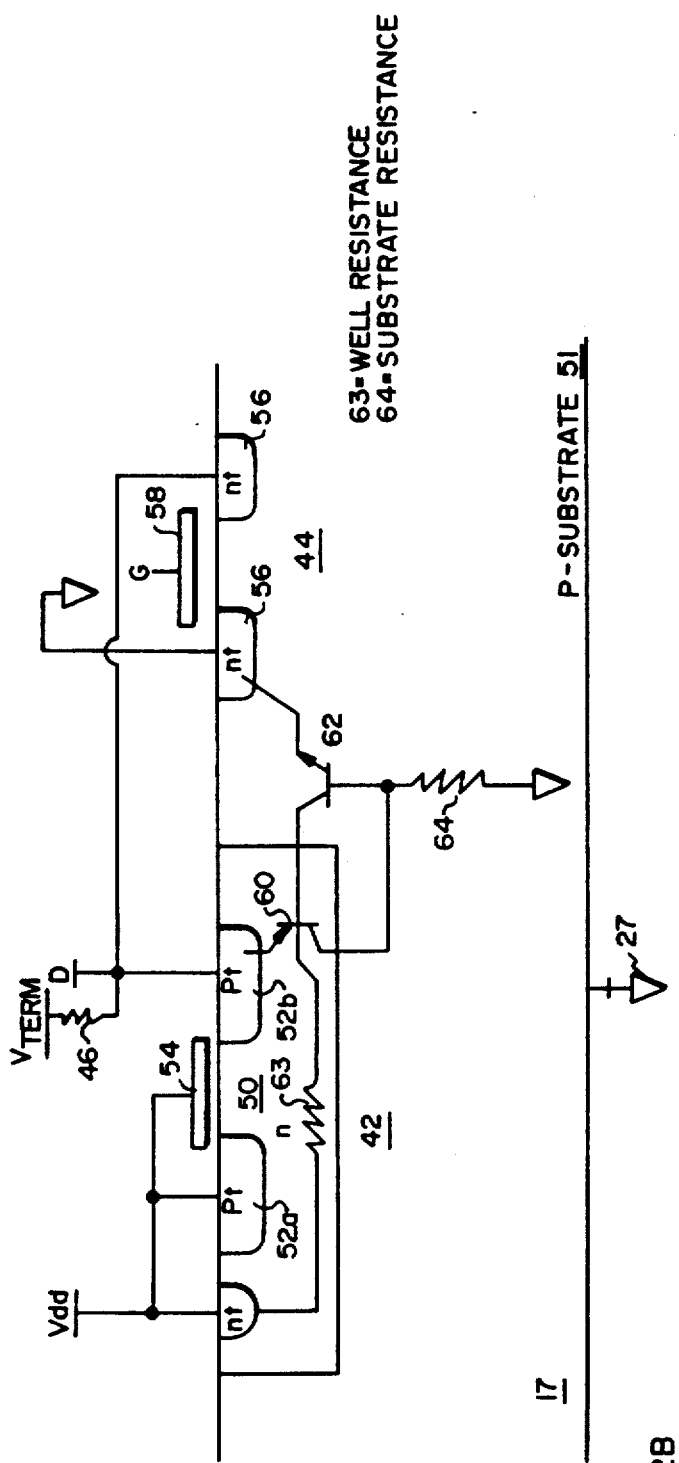
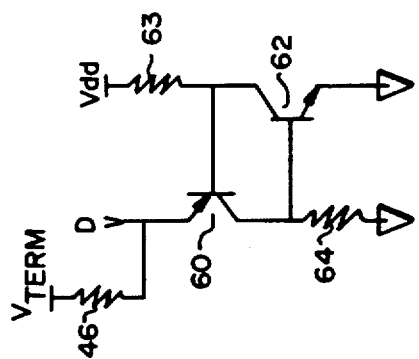
FIG. 2C
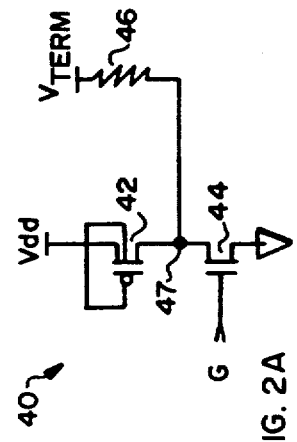
FIG. 2B
FIG. 2A

POWER SUPPLY INTERLOCK FOR A DISTRIBUTED POWER SYSTEM

FIELD OF THE INVENTION

The present invention relates to power supplies for electronic systems, and in particular to a power supply interlock technique for distributed power supplies which protects integrated circuits from damage during startup or when one of the power supplies malfunctions.

BACKGROUND OF THE INVENTION

The vast majority of present day electronic systems use metal oxide semiconductor (MOS) integrated circuits (ICs). It is increasingly common for different types of MOS circuits to be used in a given system. For example, older MOS devices typically operate from a five volt power supply. However, newer MOS devices are now available which operate with reduced power supply voltages such as three volts, or even two volts. Reducing the power supply voltage conserves power and increases operating speed. In other situations, a reduced logic voltage level, such as two volts, may be used to transmit signals along a bus which interconnects a large number of MOS components which individually operate at the five volt level. This also provides reduced power consumption and increased operating speed for the circuits connected to the bus.

Certain circuit designs are known which provide level shifting between five volt logic signals and two volt logic signals. Unfortunately, because the MOS transistors in such circuits must necessarily be coupled to two different supply voltages, they are prone to a so-called latch-up problem. In particular, such a circuit typically contains a stage consisting of a P-channel pull-up transistor connected to a five volt supply, and an output node, with an N-channel pull-down transistor coupled to a ground reference supply and the output node. This arrangement is quite common in the standard input or output stage of a complimentary metal oxide semiconductor (CMOS) logic circuit, and also exists in a CMOS logic circuit which uses the P-channel device for electrostatic discharge protection, i.e., an open drain output.

Parasitic bipolar transistors are created between the P-type and N-type regions in such a circuit. This is not normally a problem, but can become so if the parasitic bipolar transistors are biased to an active, or on, state. This may occur if an external voltage such as terminating voltage is applied to the output pin before the supply voltage is applied. If the terminating voltage is supplied to the output pin first, the parasitic transistors may become forward biased, and draw enough current to cause the MOS devices to remain latched in a particular state, with potentially damaging results.

The latch-up problem is not particularly difficult to solve in a system having a central power supply which serves all of the integrated circuits interconnected by the bus. In such a system, the central power supply may include a delay circuit which prevents the terminator volt power supply from operating until after the supply voltage is available.

However, in certain other system configurations the power supply-induced latch-up problem is more difficult to handle. For example, the system designer may require that each circuit board module have its own power supply that operates independently of the power supplies on the other modules. This has an advantage in that the total power dissipation automatically scales as modules are inserted or removed, which is particularly advantageous in a system such as a digital computer, where various system configurations require various different types and numbers of modules.

However, the bus interface latch-up problem can be difficult to solve in a distributed power supply system. Even if each power supply contains a delay circuit, a termination supply signal originating on a particular module which is operating properly may be passed along the bus to a module which has a malfunctioning power supply. As a result, the devices connected to the bus in the malfunctioning module may still enter latch-up. A latch-up problem can also occur when one of the power supplies fails during normal operation, or during a power-down sequence, when the power supplies on different modules are disabled at different times.

What is needed is a way to prevent power supply-induced latch-up in MOS integrated circuits that operate off of two or more different supply voltages, where the system uses multiple distributed power supplies that are physically located on a number of different circuit board modules.

SUMMARY OF THE INVENTION

Briefly, the invention is an electronic system wherein metal oxide semiconductor (MOS) integrated circuits (ICs) are mounted on a number of circuit board modules. The integrated circuits on each module require at least two power supplies, namely a high voltage supply and low voltage supply; the high and low voltage supplies are contained on each module.

A common enable signal, such as an open-collector or open-drain enable signal, is controlled by each module in the system. The enable signal is normally set to a logic true level when all of the power supplies in the system are operating properly. However, the enable signal is pulled to a logic false level by any one of the modules when that module's high voltage supply malfunctions.

The state of the enable line is also sensed by each module to control its respective low voltage supply. Thus, none of the low voltage power supplies are permitted to operate until the enable line is released, indicating that all modules have a properly operating high voltage supply.

As a result, the parasitic transistors in MOS devices which drive signals on a system data bus are never forward biased to cause latch-up.

BRIEF DESCRIPTION OF THE DRAWINGS

FIG. 2A is a circuit diagram of a bus driver circuit;

FIG. 2B is a cutaway view of a planar metal oxide semiconductor (MOS)-type implementation of the bus driver showing the parasitic transistors which may latch in a fixed state upon the application of a low voltage signal when a high voltage power supply signal is not available;

FIG. 2C is a circuit diagram of the parasitic transistors and impedances in the bus driver;

DETAILED DESCRIPTION OF ILLUSTRATIVE EMBODIMENTS

1. INTRODUCTION

Figure 1:
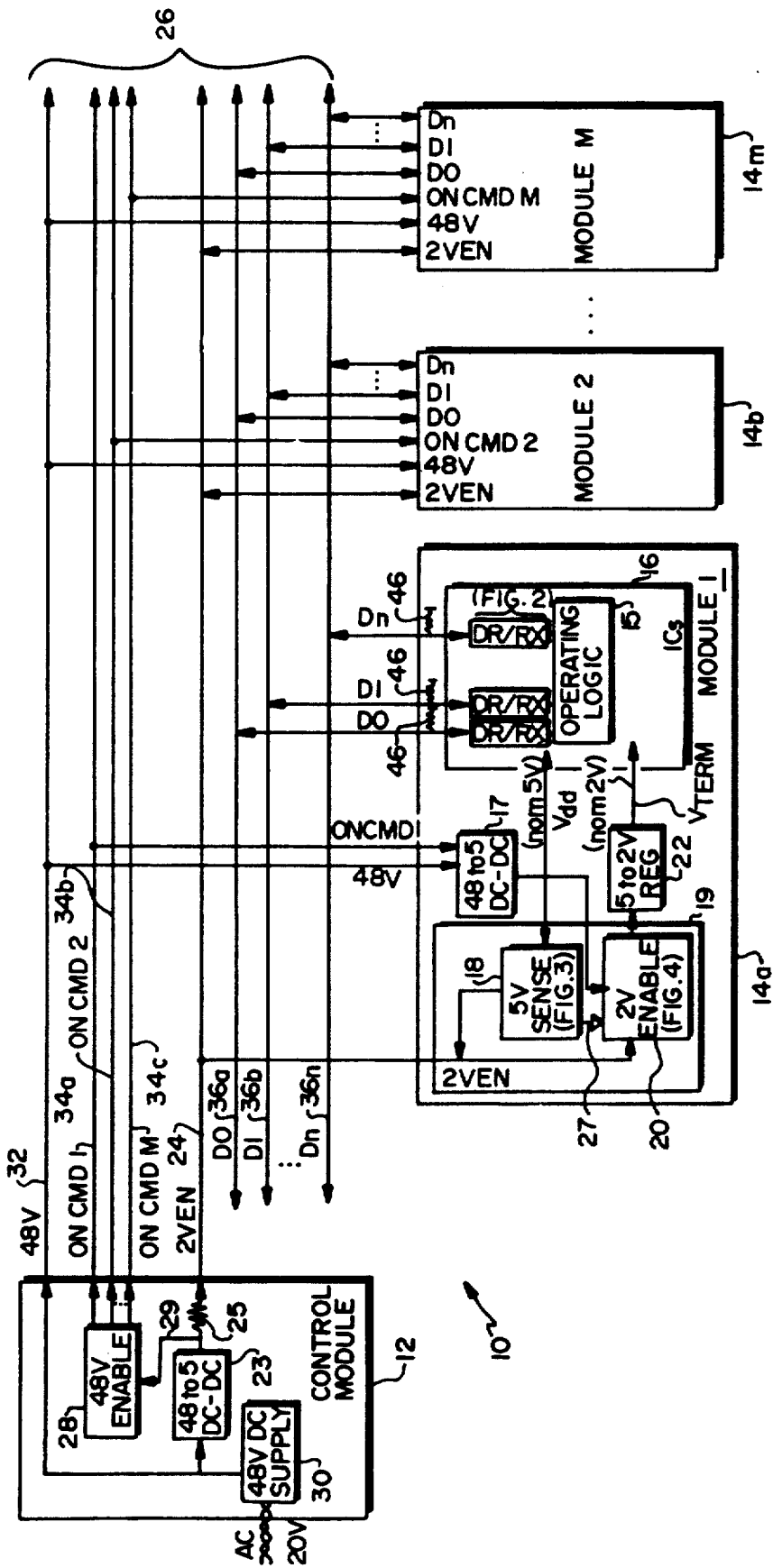
FIG. 1 is a block diagram of a multiple module computer system having distributed power supplies, a data bus, and power supply interlock circuit according to the invention.

FIG. 1 is a block diagram of an electronic system 10 which includes a control module 12 and a number, m, of printed circuit board modules 14a, 14b . . . , 14m (collectively referred to as the modules 14). The modules 14 are identical to one another, and therefore only module 14a is shown in detail.

The system 10 contains power supplies which are distributed among the modules 14. Thus, each module has mounted therein all of the necessary power supplies required by its respective operating logic 15. In the illustrated embodiment, the modules 14 each contain a forty-eight-volt-to-five-volt direct current (DC)-to-DC converter 17, which provides a high supply voltage of five volts (Vcc), and a regulator 18, which provides a reduced supply voltage, such as two volts (Vdd).

Each module 14 contains operating logic circuits 15 designed to accomplish the specific tasks assigned to the module 14, typically in the form of integrated circuits (ICs) 16. The ICs 16 require both the five volt supply as well as the two volt supply in order to operate properly.

Each module 14 also includes a supply control circuit 19 consisting of a five volt sense circuit 18 and a two volt enable circuit 20. According to the invention, each sense circuit 18 drives a two volt enable signal (2VEN) 24, which is provided to each of the modules 14 via a bus 26. The enable circuit 20 on each module senses the state of the 2VEN signal, and prevents each of the two volt regulators 22 on the respective modules 14 from operating until such time as the every one of the sense circuits 18 indicates that all of the five volt converters 17 are operating properly. As a result, none of the two volt regulators 22 is permitted to provide two volts to the ICs 16 until such time as each module 14 has five volts available.

2. THE COMMON ENABLE LINE USED BY EACH MODULE

Continuing to refer to FIG. 1, the control module 12 contains a forty-eight-volt-to-five volt DC to DC converter 23, a forty-eight volt enable circuit 28, and a forty-eight volt DC supply 30. The control module 12 is a module which is always present in the system 10.

The forty-eight volt supply 30 is conventional and operates from a source of alternating current (AC) voltage, such as the 120 volt AC line available in North America, to provide a forty-eight volt DC signal 32. The forty-eight volt DC signal 32 is provided by the control module 12 to each of the modules 14a, 14b, . . . 14m via a bus 26.

In addition, the forty-eight-to-five-volt DC-to-DC converter 23 on the control module 12 provides a five volt DC supply signal 29 to drive logic circuits in the forty-eight volt enable circuit 28. The forty-eight volt enable circuit 28, in turn, provides logic signals ONCMD1 34a, ONCMD2 34b, . . . ONCMDm 34m, to each of the modules 14a, 14b, . . . 14m via the bus 26. The ONCMD signals 34 control the operation of the DC-to-DC converters 17 in each of their respective modules 14.

When the forty-eight volt DC signal 32 is active, but before the forty-eight-volt enable logic 28 asserts any of the ONCMD signals 34, the 2VEN signal is pulled to a logic level by the five volt supply voltage 29, through a pull-up resistor 25. At the same time, each of the sense circuits 18 on the modules 14 is arranged to pull the 2VEN line low, to a ground reference voltage 27.

When the DC-to-DC converter 17 in module 14a receives both the forty-eight volt DC signal 32 as well as a logic true ONCMD1 signal 34a, the forty-eight-to-five volt DC to DC converter 17 is enabled and begins to provide the five volt power signal, Vcc, to the integrated circuits 16 and other components on module 14a.

When this occurs, the sense circuit 18 on module 14a detects that its associated DC to DC converter 17 is operating properly. As a result, the sense circuit 18 ceases pulling the two volt 2VEN signal 24 to the ground reference 27, such as by releasing it via switching to a high output impedance. However, the 2VEN signal 24 is held to the ground reference voltage 27 until each of the modules 14a, 14b . . . 14m has its respective sense circuits 18 in a state which releases the 2VEN signal line 24.

The two volt enable logic 20 in each module 14 contains circuits which sense the state of the 2VEN signal line 24 and permit its respective regulator 22 to generate the two volt supply signal Vdd only when the 2VEN signal line 24 is at a logic high voltage. Monitoring of the 2VEN signal by the enable circuit 20 is continuous, since a fault on the five volt DC-to-DC converter 17 on any particular module 14 may occur while the system is operating, or even during an improper power-down sequence.

3. THE CMOS BUS LATCH-UP PROBLEM

The source of the bus latch-up problem solved by the invention may be now understood in more detail. Certain of the integrated circuits 16 on each module 14 typically include metal oxide semiconductor (MOS) driver/receiver circuits 40 that enable logic signals to be transmitted and received between modules 14 via a data signal portion 36a, 36b, . . . , 36n of the bus 26. The data bus 26 also includes distributed termination resistors 46 connected between a data terminal (D) 47 and a two-volt termination supply voltage, Vterm.

A circuit diagram of an exemplary MOS open drain driver/receiver 40 is shown in FIG. 2A. It consists of a P-channel transistor 42 connected in a diode configuration, an N-channel pull-down transistor 44, and a pull-up resistor 46 used as a termination impedance. The N-well of transistor 42 is coupled through an N+ diffusion to a supply voltage, Vdd. A five-volt signal appearing at a gate input G will activate the pull-down transistor 44, thereby causing a low voltage to appear at the data terminal D. A zero-volt signal appearing at the gate G disables the pull-down transistor 44, thereby causing the two volts supplied by Vterm to appear at the data terminal D, through the termination impedance 46 in module 14a. The P-channel transistor 42 and any associated impedances are typically included for electrostatic discharge protection, but may have other purposes as well, such as assisting with conversion between the five- and two-volt logic levels.

A cutaway view of a planar integrated circuit 16 in which the driver/receiver 40a has been implemented is shown in FIG. 2B. The source and drain terminals of the N-channel transistor 44 are formed from a pair of N-type diffusions 56a and 56b. The gate is formed by an appropriate gate structure 58 which creates a conductive channel between the source and drain when activated. The P-channel transistor 42 consists of an N-type well diffusion region 50 and a pair of P diffusion regions 52a and 52b that form the source and drain of transistor 42, respectively. A gate 54 is formed between the P diffusions 52a and 52b. The integrated circuit 16 has a P-type substrate 51, which presents a finite parasitic resistance 64 between the N-well 50 and ground 27.

Latch-up of the driver 40 occurs because of the parasitic bipolar transistors 60 and 62 formed in such a circuit. In particular, a first parasitic PNP transistor 60 is formed by P region 52b, N-well 50, and the P-type substrate. A second parasitic NPN transistor 62 is formed by N-region 56, the P-type substrate 51 and N-well 50. Another resistance 63 is presented by the N-well 50 between Vdd and the base of the parasitic transistor 60.

A schematic of the parasitic transistors 60 and 62, termination resistance 46, and resistances 63 and 64 is shown in FIG. 2C. If the two volt termination supply Vterm is activated first, without Vdd being available, the PN junction formed by P region 52b and N-well 50 is forward biased, which activates the PNP transistor 60. Since the collector of transistor 60 is, in turn, coupled to the base of transistor 62, transistor 62 also turns on when the voltage across substrate resistance 64 exceeds approximately 0.6 volts.

Unfortunately, if the transistors 60 and 62 are activated when the five volt, Vdd supply finally turns on, and if the substrate resistance 64 is high enough, a voltage persists sufficient to bias the base of transistor 62 which thus remains on, and continues to feed back to the base-emitter PN junction of transistor 60. Transistors 60 and 62 will thus both remain in the on state, which prevents the MOS device 44 from switching state, such as when the voltage at the gate terminal G changes.

The latch-up situation can be avoided in most operating logic circuits 15 by insuring that the P substrate resistance 64 is fairly low, to prevent creating sufficient bias to turn on transistor 62. However, the driver 40 is typically connected to a bus 36 having a number of modules 14 and hence many termination resistors 46 connected to it. The collective resistance of so many termination resistors 46 may be fairly low, making it quite easy to obtain the necessary bias voltage to enable the parasitic transistors 60 and 62.

Thus, the true key to solving the bus latch-up problem is to insure that the Vdd supply is always turned on before the termination supply voltage, Vterm, so that the parasitic transistor 60 is never forward biased sufficiently to activate transistor 62, as was described above.

4. DETAILS OF THE SENSE AND ENABLE CIRCUITS

Figure 3:
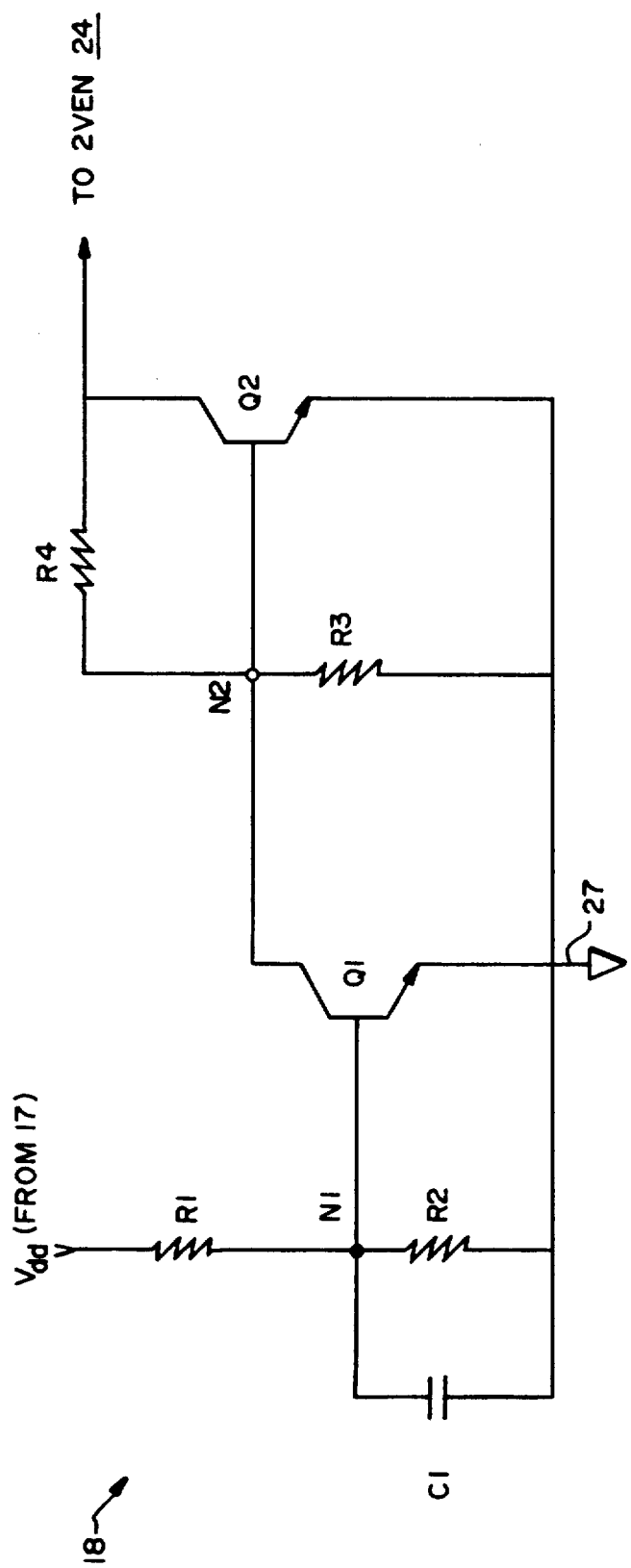
FIG. 3 is a detailed circuit diagram of a high voltage sense circuit forming part of the system shown in FIG. 1.

FIG. 3 is a detailed circuit diagram of a preferred embodiment of the five-volt sense circuit 18. As previously mentioned, the purpose of the sense circuit 18 is to pull the 2VEN signal 24 down to a ground reference voltage 27 until such time as the five volt supply signal Vdd is provided by the local DC-to-DC converter 17.

The sense circuit 18 consists of a pair of resistors R1 and R2 that form a voltage divider which operates off the Vcc voltage generated by the local DC-to-DC converter 17; the output of the voltage divider is provided at a node N1. A capacitor C1 and resistor R2 are connected in parallel between the node N1 and ground 27. The base of an NPN transistor Q1 is also connected to the node N1. The emitter of Q1 is tied to the ground 27 and its collector to a second node N2. A resistor R3 is connected between node N2 and ground 27, and another resistor R4 is connected between node N2 and the 2VEN signal 24. The base of a second NPN transistor Q2 is connected to the node N2. The collector of Q2 is connected to the 2VEN signal 24, and the emitter to ground 27.

Briefly, the sense circuit 18 takes some of the energy provided by the Vdd output from its active DC-to-DC converter 17 and biases the NPN transistor Q1 on. This, in turn, tends to establish a bias through resistors R4 and R3, to turn Q2 off, thereby presenting a high impedance to the 2VEN line 24, which thereby frees that line to be controlled by a sense circuit 18 in another module 14. If, however, no local Vdd signal is available to the sense circuit 18, Q1 remains off, and the voltage provided through the 2VEN line 24 biases the transistor Q2 on, through the pull-up resistance 25 on the control module 12 (FIG. 1). This, in turn, tends to keep the collector of Q2 at or below one volt or so, which, of course, insures that the 2VEN signal line 24 is also pulled down, below one volt, across all of the modules 14.

Figure 4:
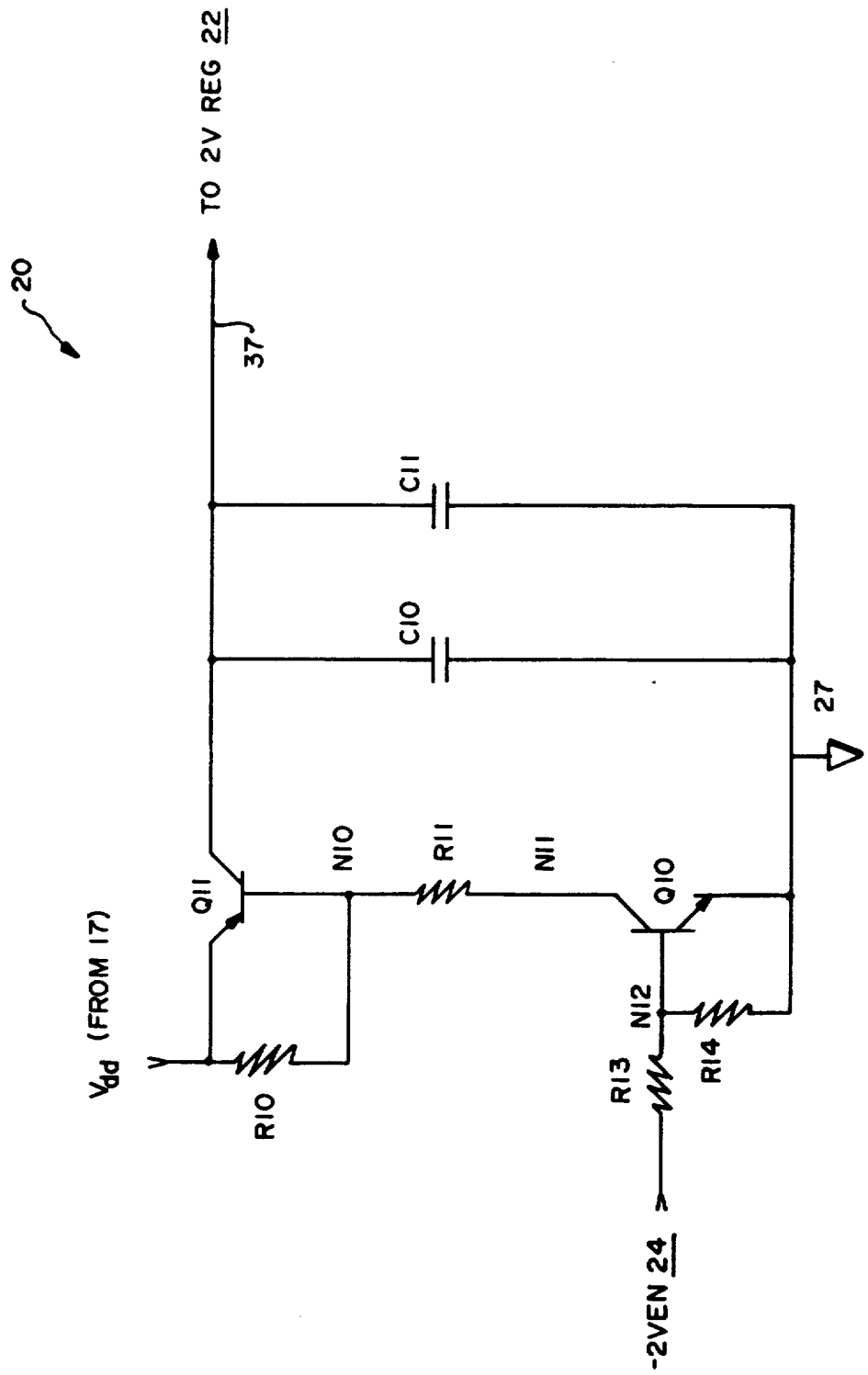
FIG. 4 is a detailed circuit diagram of a low voltage enable circuit of the system in FIG. 1.

FIG. 4 is a detailed circuit diagram of one embodiment of the enable circuit 20. The enable circuit 20 accepts the Vdd signal from its local five volt converter 17 and the 2VEN signal 24, and controls the operation of the two volt regulator 22 on its associated module 14.

The enable circuit 20 consists of a resistor R10 connected between Vcc and a node N10. A transistor Q11, which is a PNP transistor, has its emitter connected to the Vcc terminal, its base connected to node N10, and its collector connected to the input 37 of the two volt regulator 18. A resistor R11 is connected between the node N10 and another node N11. The 2VEN signal 24 is connected to a node N12 through a series resistor R13. The node N12 is also connected through a resistor R14 to ground, as well as to the base of an NPN transistor Q10. The collector of transistor Q10 is connected to node N11 and its emitter is connected to ground 27. A pair of capacitors C10 and C11 are connected between the collector of the transistor Q11 and ground 27.

In operation, if the 2VEN signal line 24 is at a high voltage, the NPN transistor Q10 turns on, which biases the PNP transistor Q11 on. The PNP transistor Q11 then acts as a pass element to cause the Vcc voltage to appear at the input 27 of the two-volt regulator 22. However, if the 2VEN signal line 24 is low, the transistor Q10 is turned off, which in turn prevents the pass transistor Q11 from conducting Vcc to the two-volt regulator. The regulator 22 is thus disabled as a result.

The various biasing resistances R10, R11, R13 and R14 are selected such that in the fault condition, where the 2VEN line 24 is high, all of the PNP and NPN transistors Q10 and Q11 in each of the modules 14 are turned off.

The foregoing description has been limited to a specific embodiment of this invention. It will be apparent, however, that variations and modifications may be made to the invention, with the attainment of some or all of its advantages. For example, although the 2VEN line 24 has been described as an open collector-type line controlled by a sense circuit 18 and enable circuit 20 that use bipolar transistors, it should be understood that the circuits 18 and 20 may be implemented using MOSFETs, in which case the 2VEN line is technically an open drain-type line.

Furthermore, the foregoing discussion has assumed that a logic high level is provided by a high voltage, such as five or two volts, and logic low by a low voltage, such as ground, but other logic conventions may be used.

In addition, the five-volt and two-volt power supplies on each module have been described as DC-to-DC converters 17 and regulators 22, respectively. However, those skilled in the art will recognize that other types of power supply components, such as DC power supplies operating directly off of the AC line voltage may be used in each module 14.

Therefore, it is the object of the appended claims to cover all such variations and modifications as come within the true spirit and scope of the invention.

What is claimed is:

1. An electronic system including a plurality of circuit board modules, wherein each module includes metal oxide semiconductor (MOS) logic circuits, and wherein logic signals are transmitted between the logic circuits on different modules via a multiple signal data bus, with one of the data bus signals being an enable signal, and wherein each of the circuit board modules comprises:

a power supply, which normally provides a power supply voltage to the logic circuits located in the module;

a termination supply, which normally provides a termination voltage to the logic circuits located in the module, and the termination supply having an enable input; and a power supply interlock circuit connected to control the enable input of the termination supply, the interlock circuit comprising:

a sensing circuit, connected to the power supply voltage and the enable input, and connected to set the enable signal to a logic false level when the power supply is not providing the supply voltage, and also connected to set the enable signal to a logic true level when the power supply is operating normally and providing the power supply voltage; and an enabling circuit, connected to the supply voltage and the enable signal, for activating the enable input of the termination supply only when the enable signal is in the logic true state indicating that all of the power supplies are operating normally.

2. An electronic system as in claim 1 wherein the power supply is a direct-current(DC)-to-DC converter.

3. An electronic system as in claim 1 wherein the termination supply is a voltage regulator.

4. An electronic system as in claim 1 wherein the enable signal is an open-collector signal which is normally pulled to a deasserted voltage level by another power supply which is known to always be installed in the system, the open-collector enable signal being deasserted through a pull-up resistor, and wherein the sensing circuits assert the open-collector enable signal to indicate that their respective power supplies are not operating normally.

5. An electronic system as in claim 4 wherein the enabling circuit activates the enable input of its respective termination supply by coupling the power supply voltage from its respective power supply to the termination supply only when the open-collector enable signal is deasserted.

6. An electronic system as in claim 1 wherein the sensing circuit comprises:

a first transistor having an enable terminal and a pair of signal terminals, the enable terminal being connected to receive the votlage provided by the power supply, and a first one of the signal terminals being connected to a ground reference voltage; and a second transistor having an enable terminal and a pair of signal terminals, the enable terminal being connected to a second one of the signal terminals in the first transistor, a first one of the signal terminals of the second transistor being connected to the ground reference voltage, and a second one of the signal terminals in the second transistor providing the enable signal.

7. An electronic system as in claim 6 wherein the first and second transistors are bipolar transistors, and the enable terminals of the first and second transistors are base terminals, and the first and second signal terminals of the transistors are collector and emitter terminals, respectively.

8. An electronic system as in claim 1 wherein the enabling circuit comprises:

a first transistor having an enable terminal and a pair of signal terminals, the enable terminal being connected to the enable signal, and a first one of the signal terminals being connected to a ground reference voltage; and a second transistor having an enable terminal and a pair of signal terminals, the enable terminal being connected to a second one of the signal terminals of the first transistor, a first one of the signal terminals in the second transistor being connected to the voltage provided by the power supply, and a second one of the signal terminals in the second transistor being connected to the enable input of the termination supply.

9. A power supply interlock circuit for use in electronic system which includes a plurality of circuit modules, wherein each module includes metal oxide semiconductor (MOS) logic circuits that require both a high supply voltage, Vdd, as well as a low termination voltage, Vterm, which is lower than Vdd, and the Vterm and Vdd voltages for each module being generated by voltage generator circuits located on each module, and wherein logic signals are transmitted between the logic circuits on different modules via a multiple signal data bus, each of the data bus signals being connected to a termination impedance located on each of the modules, and where a common Vterm-enable signal is bussed to each of the modules, and an interlock circuit is located on each of the modules, the interlock circuits each comprising:

a sensing circuit, connected to the Vdd voltage and the common Vterm-enable signal, and connected to set the common Vterm-enable signal to a logic false level when the Vdd voltage is not within its nominal operating range, and also connected to set the common Vterm-enable signal to a logic true level when the Vdd voltage is within its nominal operating range; and an enabling circuit, connected to the Vdd voltage and the common Vterm-enable signal, for activating the power supply which provides the Vterm voltage only when the common Vterm-enable signal is in the logic true state indicating that all of the Vdd power supplies are generating Vdd voltages within their nominal operating ranges.

10. A power supply interlock circuit as in claim 9 wherein the Vdd voltage is generated by a direct current (DC)-to-DC converter.

11. A power supply interlock circuit as in claim 9 wherein the Vterm voltage is generated by a voltage regulator.

12. A power supply interlock circuit as in claim 9 wherein the common Vterm-enable signal is an open-collector enable signal which is normally pulled to the Vdd voltage by a separate power supply which is isolated from the other module power supplies, the open-collector enable signal being pulled high through a pull-up resistor connected to the separate power supply.

13. A power supply interlock circuit as in claim 12 wherein the sensing circuit pulls the open-collector enable signal down to a ground reference voltage to indicate that the Vdd voltage generated by its respective local power supply is not within the nominal operating ranges.

14. A method for preventing a latch-up state from occurring in metal oxide semiconductor (MOS) logic circuits which use both a high operating supply voltage, Vdd, and a low bus termination voltage, Vterm, with Vterm being lower than Vdd, and where the Vterm and Vdd voltages are separately generated for the logic circuits on each of a plurality of logic circuit modules, the latch-up state being caused by the activation of parasitic devices when the termination Vterm, voltage, is enabled without the Vdd supply voltage being enabled, the method comprising the steps of:

sensing the state of the Vdd voltage generated in each module, and setting a common Vterm-enable signal to a logic false level when the Vdd voltage in any module is not within its nominal operating range, and otherwise setting the common Vterm-enable signal to a logic true level when the Vdd voltages are all within their nominal operating ranges; and connecting the Vterm supply voltage to the logic circuits in each of the modules only when the common Vterm-enable signal is in the logic true state.

* * * * *